United States Patent
Levin et al.

(10) Patent No.: US 10,401,393 B2
(45) Date of Patent: Sep. 3, 2019

(54) METHOD FOR DETERMINING PERSISTENT CRITICAL CURRENT OF SUPERCONDUCTING MATERIALS

(71) Applicant: U.S. Army Research Laboratory ATTN: RDRL-LOC-I, Adelphi, MD (US)

(72) Inventors: George A. Levin, Vero Beach, FL (US); Paul N. Barnes, Silver Spring, MD (US); Charles C. Rong, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/635,664

(22) Filed: Jun. 28, 2017

(65) Prior Publication Data
US 2017/0370970 A1    Dec. 28, 2017

Related U.S. Application Data

(60) Provisional application No. 62/355,492, filed on Jun. 28, 2016.

(51) Int. Cl.
*G01R 15/20*  (2006.01)
*G01R 19/00*  (2006.01)
*G01R 33/12*  (2006.01)

(52) U.S. Cl.
CPC ....... *G01R 15/207* (2013.01); *G01R 19/0092* (2013.01); *G01R 33/1238* (2013.01); *G01R 33/1246* (2013.01)

(58) Field of Classification Search
CPC .................................................. G01R 33/1238
See application file for complete search history.

(56) References Cited

U.S. PATENT DOCUMENTS 4,238,749 A    12/1980  Lawson
5,110,793 A     5/1992  De
(Continued)

OTHER PUBLICATIONS

George A. Levin, et al., "Persistent current in coils made out of second generation high temperature superconductor wire," Applied Physics Letters, vol. 93, 062504 (2008).
(Continued)

*Primary Examiner* — Clayton E. LaBalle
*Assistant Examiner* — Jas A Sanghera
(74) *Attorney, Agent, or Firm* — Christos S. Kyriakou (57) ABSTRACT

A method of measuring superconducting critical current in persistent mode using superconducting closed loops which allow the persistent current to flow without any joints. This persistent critical current is different than traditional resistive critical current that is the upper limit of the superconducting current carrying capacity, and provides the information about the range of critical current in persistent mode that is more close to applications in MRI, SMES, and Maglev operations. The measurement can be used as a quality control method in the manufacturing process and a piece of crucial information to magnet manufacturers for the design and fabrication of magnet. The superconducting materials include the second generation superconducting wires (coated conductors) based on Rare Earth (RE) Barium Copper Oxide superconducting material ($REBa_2Cu_3O_{6+x}$, REBCO), or any other type of superconducting wires that can be manufactured in the form of tape.

20 Claims, 5 Drawing Sheets

(56) References Cited

U.S. PATENT DOCUMENTS

| | | | |
|---|---|---|---|
| 5,936,401 A * | 8/1999 | Drehman | G01R 33/1238 |
| | | | 324/201 |
| 6,569,811 B1 | 5/2003 | Shi | |
| 7,566,684 B1 | 7/2009 | Levin et al. | |
| 8,178,473 B2 | 5/2012 | Hong et al. | |
| 8,712,489 B2 | 4/2014 | Schauwecker et al. | |
| 2002/0000807 A1* | 1/2002 | Nakamura | G01R 33/3815 |
| | | | 324/315 |
| 2009/0168286 A1* | 7/2009 | Berkley | B82Y 10/00 |
| | | | 361/141 |
| 2013/0190187 A1 | 7/2013 | Sumption | |
| 2014/0120523 A1 | 5/2014 | Lowery, Jr. | |
| 2014/0235451 A1* | 8/2014 | Uglietti | H01F 6/02 |
| | | | 505/211 |
| 2015/0323281 A1 | 11/2015 | Gonzaga | |

OTHER PUBLICATIONS

Charles C. Rong, et al., "Investigation of the Relaxation of Persistent Current in Superconducting Closed Loops Made Out of YBCO Coated Conductors," IEEE Transactions on Applied Superconductivity, vol. 25, No. 3, Jun. 2015.

* cited by examiner

METHOD FOR DETERMINING PERSISTENT CRITICAL CURRENT OF SUPERCONDUCTING MATERIALS

CROSS REFERENCE TO RELATED APPLICATION

This application claims the benefit of U.S. Provisional Patent Application No. 62/355,492 filed on Jun. 28, 2016, the contents of which, in its entirety, is herein incorporated by reference.

GOVERNMENT INTEREST

The embodiments herein may be manufactured, used, and/or licensed by or for the United States Government without the payment of royalties thereon.

BACKGROUND

Technical Field

The embodiments herein generally relate to superconductors, and more particularly to current flow in superconductors.

Description of the Related Art

Conventional ways to evaluate the coated conductor quality and performance currently used in the manufacturing is called the critical current. The conventional critical current is defined as the superconducting current at which applies an electric field at the threshold of $E_0 = 10^{-4}$ V/m. The value of critical current is useful for applications in which the superconducting wires do not operate in persistent mode (such as a cable carrying a certain current from a power source).

However, for other applications of magnets such as magnetic resonance imaging (MRI) and superconducting magnetic energy storage (SMES), this parameter is not enough to allow a reliable evaluation of the quality of the wire because the critical persistent current is more relevant to the operation of these magnets. Although the conventional critical current indicates what the upper limit of the superconducting current may be, the magnet, however, does not work at that level of the current based on conventional processes.

SUMMARY

In view of the foregoing, an embodiment herein provides a method of measuring superconducting critical current in persistent mode, the method comprising providing a close loop superconductor assembly; simultaneously cooling and applying a first magnetic field to the assembly, wherein the cooling comprises lowering a temperature of the assembly below a superconducting critical temperature; removing the first magnetic field from the assembly upon reaching below the superconducting critical temperature thereby initiating a persistent superconducting current in the assembly; increasing the temperature of the assembly; measuring a variation of a second magnetic field in the assembly in response to the increasing temperature; and calculating a corresponding persistent critical current in the assembly. The method may further comprise cooling the assembly to below 77K. The first magnetic field is generated from a source outside of the assembly, and the second magnetic field is generated by the assembly. The method may further comprise using a cryogenic coolant to cool the assembly, wherein the cryogenic coolant may comprise any of helium, liquid hydrogen, and liquid nitrogen. The method may further comprise using a magnet to induce a superconducting current in the assembly. The assembly may comprise any of a superconductor wire and tape. The persistent critical current may be a function the increasing temperature. The assembly may comprise $REBa_2Cu_3O_{6+x}$ (REBCO).

Another embodiment provides a system for measuring superconducting critical current in persistent mode, the system comprising a close loop superconductor assembly; a temperature control unit housing the assembly and configured to cool the assembly to a temperature below a superconducting critical temperature; a magnet adjacent to the temperature control unit and configured to apply a first magnetic field to the assembly while the assembly is being cooled; means for removing the first magnetic field from the assembly upon reaching below the superconducting critical temperature thereby initiating a persistent superconducting current in the assembly; and at least one sensor configured to measure a variation of a second magnetic field in the assembly in response to increasing the temperature in the temperature control unit; and calculate a persistent critical current in the assembly. The temperature control unit may be configured to cool the assembly to below 77K. The magnet generates the first magnetic field, and the assembly generates the second magnetic field. The temperature control unit may comprise a cryogenic coolant to cool the assembly. The cryogenic coolant may comprise any of helium, liquid hydrogen, and liquid nitrogen. The magnet may be configured to induce a superconducting current in the assembly. The assembly may comprise any of a superconductor wire and tape. The persistent critical current may be a function the increasing temperature. The assembly may comprise $REBa_2Cu_3O_{6+x}$ (REBCO).

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a method to determine the persistent critical current of second generation superconducting wires/tapes (coated conductors) based on Rare Earth (RE) Barium Copper Oxide superconducting material $REBa_2Cu_3O_{6+x}$, (REBCO). The persistent critical current and method of the embodiments herein offer new ways to evaluate the coated conductor quality and performance. The conventional critical current is defined as the superconducting current at which applies an electric field at the threshold of $E_0=10^{-4}$ V/m, while the persistent critical current of the embodiments herein is defined as the superconducting current in a true persistent mode without any applied electric field at all. Referring now to the drawings, and more particularly to FIGS. 1 through 7, where similar reference characters denote corresponding features consistently throughout the figures, there are shown preferred embodiments.

Figure 1:
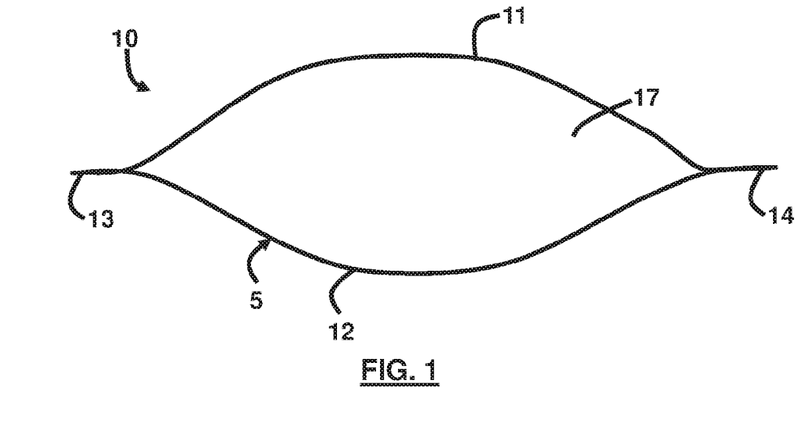
FIG. 1 is a schematic diagram of a top view of a superconductor coil according to an embodiment herein.
Figure 2:
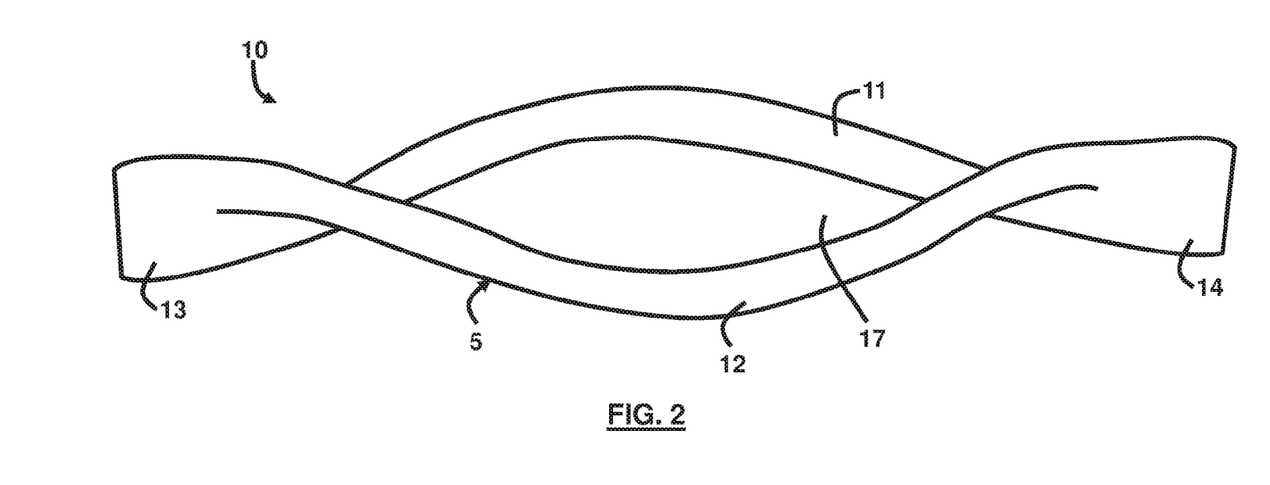
FIG. 2 is a schematic diagram of a perspective view of a superconductor coil according to an embodiment herein.

The persistent critical current of the embodiments herein is one of the characteristics related to the nature of the superconducting materials and the quality of a superconductor being manufactured. To measure the persistent critical current, a device 10, as shown in FIGS. 1 and 2, is used in order to measure the value of the persistent critical current. The device 10 is based on a close loop made of superconducting wire 5 that allows superconducting current in persistent mode without a required electric field as in the case of the conventional critical current measurement techniques. Without this close loop superconductor device 10, it is impossible to measure the persistent critical current because the persistent mode cannot be established. The device 10 comprises a superconducting wire 5 that is configured as a looped structure having a split wire configuration comprising coils or wires 11, 12 that are connected at ends 13, 14 that are integral part of the original superconducting tape/wire. The split wire configuration creates an open area 17 between wires 11, 12.

Figures 3, 4:
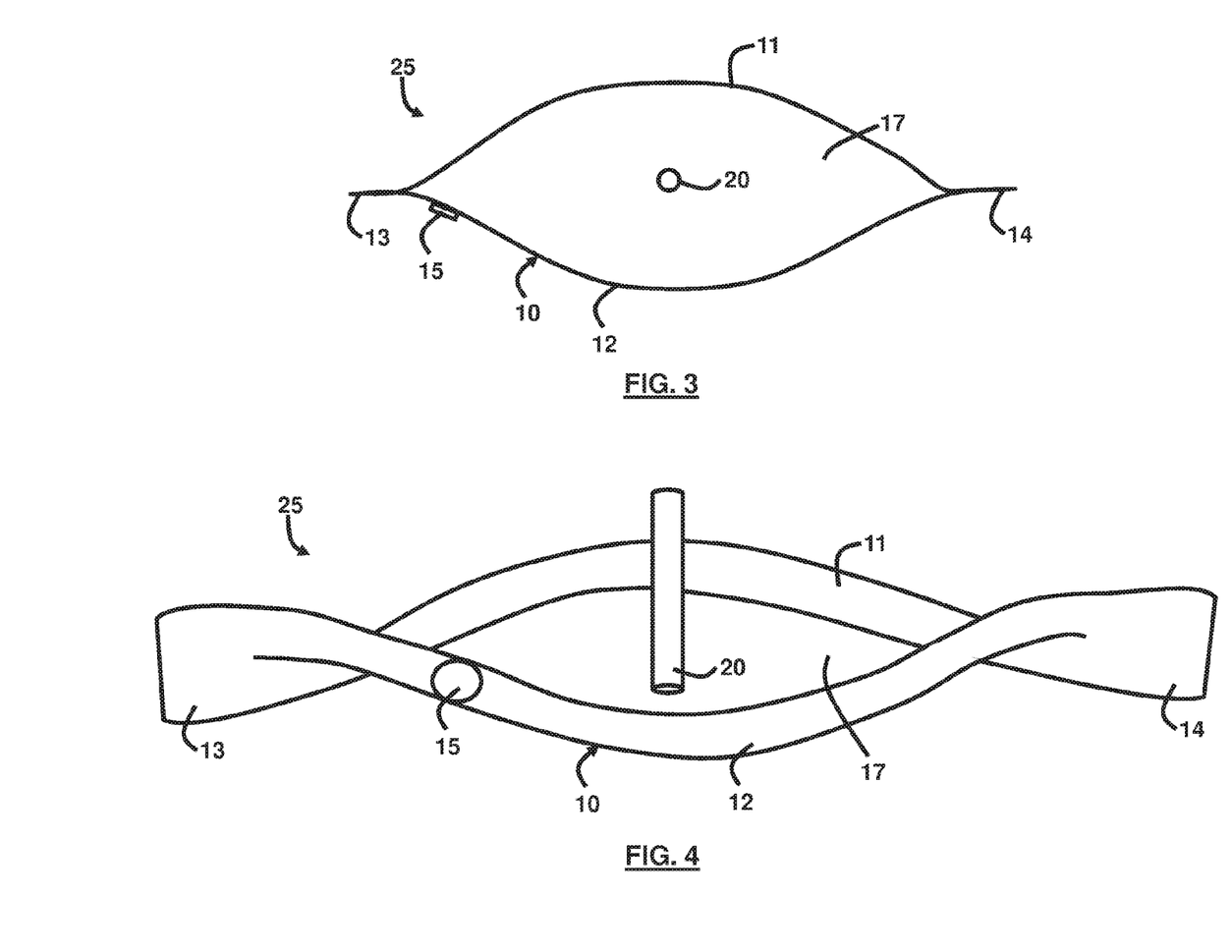
FIG. 3 is a schematic diagram of a top view of a system according to an embodiment herein.
FIG. 4 is a schematic diagram of a perspective view of a system according to an embodiment herein.
Figure 5:
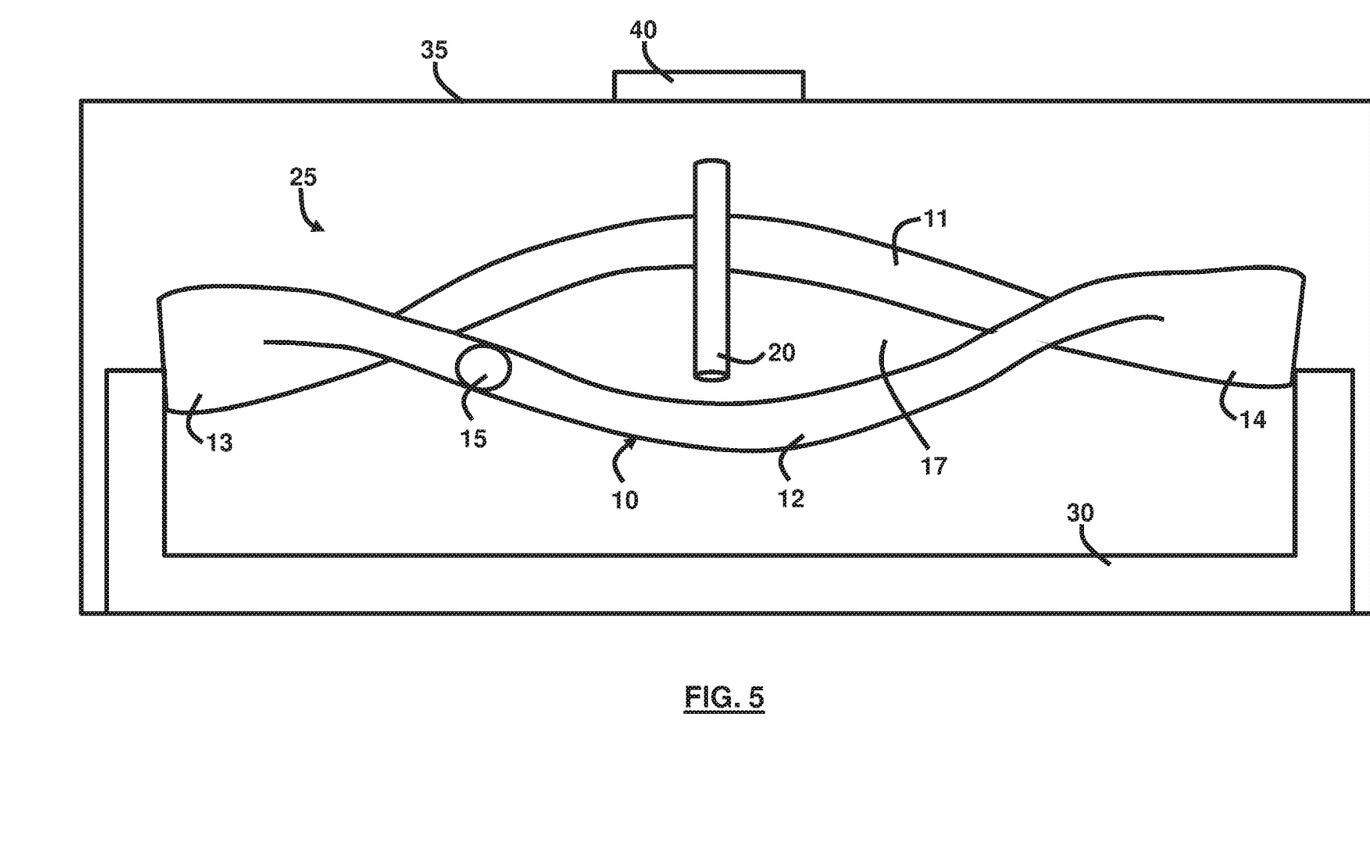
FIG. 5 is a schematic diagram of a perspective view of another system according to an embodiment herein.

FIGS. 3 and 4, with reference to FIGS. 1 and 2, illustrate an assembly 25 that utilizes the closed loop superconductor device 10. The assembly 25 further includes a sensor 20 used to measure the magnetic field and superconducting current generated in the closed loop superconductor device 10. A sensor 15 is used to measure the temperature of the device 10. As shown in FIG. 5, with reference to FIGS. 1 through 4, the assembly 25 can be mounted on a fixture 30 and inserted into a cryostat 35 that is able to cool the device 10 down to temperatures of helium in the range of 4K to 77K. For example, a temperature of approximately 25K may be used. Alternatively, any other temperatures below 77K may be used.

Figure 6:
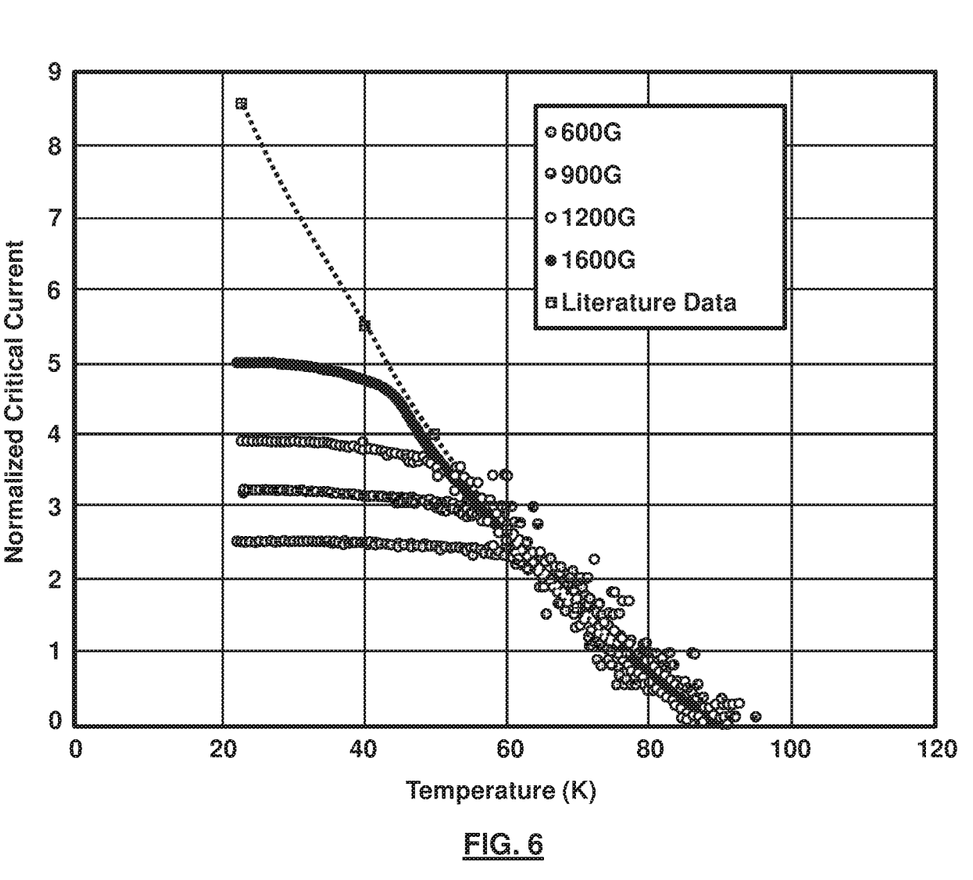
FIG. 6 is a graphical representation illustrating critical current in superconductors according to an embodiment herein.

The entire assembly 25 is inserted in the cryostat 35 that cools to temperatures down to 25K with helium as coolant medium. Alternatively, liquid hydrogen, liquid nitrogen, or any other practical cryogenic coolant may be used as the coolant medium. The cryostat 35 is equipped with an external magnet 40 that induces superconducting current in the close loop of the superconductor assembly 25. There is no connection to apply an electric field threshold of $E_0=10^{-4}$ V/m. The induction of superconducting current in the close loop assembly 25 is achieved by so called "field cooling" that is cooling the entire system while the external magnetic field is applied, and once the temperature is below the superconducting critical temperature and stabilized, the external magnetic field is turned off. The superconducting critical temperature may be considered as the temperature at which (and below which) the conductor exhibits zero resistivity, and this zero resistivity equals to superconductivity. The external magnetic field is generated by maintaining an electric current in its conducting copper coils in magnet 40. If the current is set zero, or off, by control, the magnetic field is then zero. This turn off of the external magnet field initiates a superconducting current in the close loop assembly 25 in order to obey the physical law of magnet flux conservation. Then, the temperature of the superconducting loop is slowly, raised while the magnetic field is monitored using sensor 20. For example, the time scale of this temperature rise will be in hours. In this regard, there are two different magnetic fields. One is generated by the external physical magnet 40 constructed with copper coils (not shown). When the coils energize, it creates a magnetic field that will induce superconducting current in the device 10 at the time when the external magnet 40 is turned off. The other magnetic field is the magnetic field generated in the device 10 once there is superconducting current moving inside. The quantitative strength of the magnetic field inside the wires 11, 12 is proportional to the level of the superconducting electric current moving in the coils of the device 10. By measuring the magnetic field associated with device 10 with the sensor 20, one can determine the superconducting electric current change inside device 10. At the moment that the external magnet 40 changes from a certain level to zero (i.e., when it is turned off), the superconducting current is immediately generated in device 10 as governed by the physical law of magnet flux conservation. The external magnet 40 is only used at one point in the beginning to induce superconducting current in device 10, and afterward the changes of superconducting current inside device 10 are observed. This way one can obtain, as a function of temperature, a different type of critical current, which can be called persistent critical current, as opposed to the traditional resistive critical current. Table 1 along with FIG. 6 illustrates this concept, which shows the measured persistent critical current induced by a magnetic field. It is noted that the magnetic field strength indicated in Table 1 are for illustrative purposes only, and different magnetic field strengths are possible depending on the size of the assembly 25, and the performance and number of the wires 11, 12, among other factors.

TABLE 1

Persistent Critical Current Data

|  | 38K | 23K | 23K | 23K | 23K | 23K |
|---|---|---|---|---|---|---|
| External Field (Gauss) | 600 | 600 | 900 | 1200 | 1600 | 3200 |
| Induced Field (Gauss) | 308.38 | 309.89 | 435.48 | 547.09 | 697.45 | 710.10 |
| Super Current (Amp) | 1275.9 | 1282.1 | 1801.7 | 2263.5 | 2885.6 | 2937.9 |

TABLE 1-continued

Persistent Critical Current Data

| | 38K | 23K | 23K | 23K | 23K | 23K |
|---|---|---|---|---|---|---|
| Fractional Current (%) | 43.4 | 43.6 | 61.3 | 77.0 | 98.2 | 100 |
| Relaxation Rate (1/s) | 5E−6 | 1E−6 | 5E−6 | — | 3E−4 | — |

Figure 7:
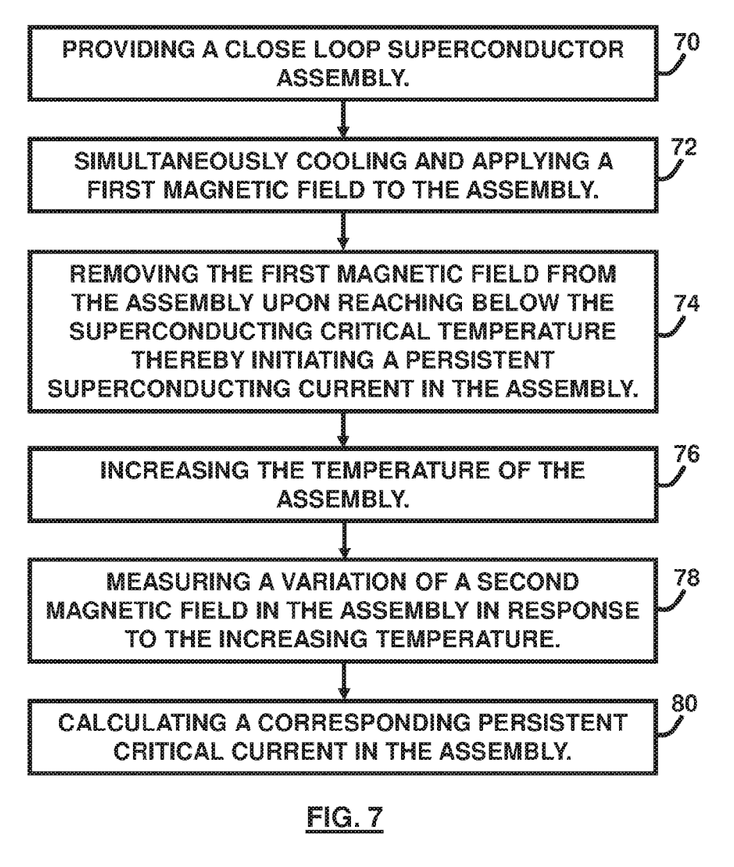
FIG. 7 is a flow diagram illustrating a method according to an embodiment herein.

FIG. 7, with reference to FIGS. 1 through 6, is a flow diagram illustrating a method of measuring superconducting critical current in persistent mode, the method comprising providing (70) a close loop superconductor assembly 25; simultaneously (72) cooling and applying a first magnetic field to the assembly 25, wherein the cooling comprises lowering a temperature of the assembly 25 below a superconducting critical temperature; removing (74) the first magnetic field from the assembly 25 (e.g., effectively reduce the electric current in the magnet 40 to zero so that the first magnetic field strength is then zero) upon reaching below the superconducting critical temperature thereby initiating a persistent superconducting current in the assembly 25; increasing (76) the temperature of the assembly 25; measuring (78) a variation of a second magnetic field in the assembly 25 in response to the increasing temperature; and calculating (80) a corresponding persistent critical current in the assembly 25. The measuring (78) and calculating (80) may occur using sensors 15, 20, and a computer (not shown), if necessary. The method may further comprise cooling the assembly 25 to below 77K. The method may further comprise cooling the assembly 25 in a cryostat 35. The first magnetic field is generated from a source (e.g., magnet 40) outside of the assembly 25, and the second magnetic field is generated by the assembly 25. The method may further comprise using a cryogenic coolant to cool the assembly 25, wherein the cryogenic coolant may comprise any of helium, liquid hydrogen, and liquid nitrogen. The method may further comprise using a magnet 40 to induce a superconducting current in the assembly 25. The assembly 25 may comprise any of a superconductor wire and tape 11, 12. The persistent critical current may be a function the increasing temperature. The assembly 25 may comprise $REBa_2Cu_3O_{6+x}$ (REBCO).

The persistent critical current is always lower than traditional resistive critical current obtained with applying an electric field threshold of $E_0=10^{-4}$ V/m, shown by the dotted line as literature data, until the temperature reaches the point at which the traditional resistive critical current is measured. The merger of the two methods at the highest temperature along the literature data line indicates that the traditional resistive critical current with an electric field threshold of $E_0=10^{-4}$ V/m is indeed the upper limit that the corresponding superconductor can reach at the artificially set of conditions. Therefore, knowing the upper limit is only part of the knowledge, but further knowing the range in a persistent mode as well will provide a more complete understanding of the behavior of the superconductors.

The embodiments herein provide a new methodology in the assessment of REBCO superconducting wire/tape in terms of persistent critical current as an intrinsic characteristic of the materials. The embodiments herein provide a new approach to assess additional aspect of the quality of the wire of a certain length (rather than those measured at one isolated point) and over a period of time (from minutes to hours) in the absence of electric driving force. The traditional resistivity based critical current of REBCO superconducting wire/tape only tells how high the superconducting current that particular wire/tape can reach under certain electric driving force, but cannot tell what the superconducting current level will be in persistent mode (i.e. when driving force is in absence). The techniques offered by the embodiments herein for MM, SMES, and Maglev operations and other related device developers allow these designers to gain additional useful information about the intrinsic characteristics of REBCO superconducting wire/tape with one step further beyond the conventional methodology.

Conventional superconductor manufacturing processes have not been provided a better way to characterize the quality and performance of the superconductors except for the above mentioned conventional critical current at which the measured electric field exceeds a threshold $E_0=10^{-4}$ V/m. The value of critical current is useful for applications in which the superconducting wires do not operate in persistent mode (such as a cable carrying a certain current from a power source). However, for other applications such as magnets in MM and SMES, this parameter (critical current) is not enough to reliably evaluate the quality of the wire/tape, and the persistent critical current is more relevant to the operation of these magnets. Although the conventional critical current indicates what the upper limit of the superconducting current may be, in practice, the magnet does not work at that level of the conventional critical current, especially when in a persistent mode.

As a result, the persistent critical current measured by embodiments herein is more close to the reality of a MM magnet and a SMES magnet in their real world operations. The conventional resistive critical current only measures the upper limit of the superconducting current level under the artificially set measuring conditions, while the embodiments herein provide an additional way to measure more realistic superconducting current levels in persistent mode. Accordingly, the embodiments herein improve the conventional solutions.

The development of advanced energy storage technology is important to operational energy security for United States military forces. Superconducting magnetic energy storage by itself, and those with rapid charging and discharging capability, are two application areas that are of particular importance. The embodiments herein will help increase superconductor based technology development to higher technology readiness level (TRL) through a better quality control process in component manufacturing, which is a key step to mature the superconductor technology to benefit military applications.

Apart from military applications, the embodiments herein provide significant commercial uses and applications as well. Since superconductivity has intrinsic uniqueness with potentials for a wide range of applications, advanced superconductor manufacturing capability is the key to make it happen in an accelerated way. The embodiments herein offer the ability to gain more information about the superconductor's performance under specific and relevant conditions for some commercial products. The immediate beneficiaries include REBCO superconducting wire manufacturers and REBCO superconducting magnet developers, as well as other devices and systems that use high temperature REBCO superconductors.

Details of the present invention were presented on Jun. 30, 2015 at the 2015 Cryogenic Engineering Conference &International Cryogenic Materials Conference in Tucson, Ariz. with the attached slide presentation titled "Persistent Current Characteristics at Temperatures Below 77K in Closed Superconducting Loops Made Out of RE123 Coated Conductors" a copy of which is attached and is hereby incorporated herein by reference in its entirety.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of measuring superconducting critical current in persistent mode, said method comprising:
   providing a close loop superconductor assembly;
   simultaneously cooling and applying a first magnetic field to said assembly, wherein said cooling comprises lowering a temperature of said assembly below a superconducting critical temperature;
   removing said first magnetic field from said assembly upon reaching below said superconducting critical temperature thereby initiating a persistent superconducting current in said assembly;
   increasing the temperature of said assembly;
   measuring a variation of a second magnetic field in said assembly in response to the increasing temperature; and
   calculating a corresponding persistent critical current in said assembly.

2. The method of claim 1, further comprising cooling said assembly to below 77K.

3. The method of claim 1, wherein said first magnetic field is generated from a source outside of said assembly.

4. The method of claim 1, wherein said second magnetic field is generated by said assembly.

5. The method of claim 1, further comprising using a cryogenic coolant to cool said assembly.

6. The method of claim 5, wherein said cryogenic coolant comprises any of helium, liquid hydrogen, and liquid nitrogen.

7. The method of claim 1, further comprising using a magnet to induce a superconducting current in said assembly.

8. The method of claim 1, wherein said assembly comprises any of a superconductor wire and tape.

9. The method of claim 1, wherein said persistent critical current is a function of said increasing temperature.

10. The method of claim 1, wherein said assembly comprises $REBa_2Cu_3O_{6+x}$ (REBCO).

11. A system for measuring superconducting critical current in persistent mode, said system comprising:
    a close loop superconductor assembly;
    a temperature control unit housing said assembly and configured to cool said assembly to a temperature below a superconducting critical temperature;
    a magnet adjacent to said temperature control unit and configured to apply a first magnetic field to said assembly while said assembly is being cooled;
    means for removing said first magnetic field from said assembly upon reaching below said superconducting critical temperature thereby initiating a persistent superconducting current in said assembly; and
    at least one sensor configured to:
        measure a variation of a second magnetic field in said assembly in response to increasing the temperature in said temperature control unit; and
        calculate a persistent critical current in said assembly.

12. The system of claim 11, wherein said temperature control unit is configured to cool said assembly to below 77K.

13. The system of claim 11, wherein said magnet generates said first magnetic field.

14. The system of claim 11, wherein said assembly generates said second magnetic field.

15. The system of claim 11, wherein said temperature control unit comprises a cryogenic coolant to cool said assembly.

16. The system of claim 15, wherein said cryogenic coolant comprises any of helium, liquid hydrogen, and liquid nitrogen.

17. The system of claim 11, wherein said magnet is configured to induce a superconducting current in said assembly.

18. The system of claim 11, wherein said assembly comprises any of a superconductor wire and tape.

19. The system of claim 11, wherein said persistent critical current is a function of said increasing temperature.

20. The system of claim 11, wherein said assembly comprises $REBa_2Cu_3O_{6+x}$ (REBCO).

* * * * *